(12) United States Patent
Kim et al.

(10) Patent No.: US 10,680,610 B2
(45) Date of Patent: Jun. 9, 2020

(54) CAPACITIVE SWITCH

(71) Applicant: SAMBO MOTORS CO., LTD., Dalseo-gu, Daegu (KR)

(72) Inventors: Jung Kyu Kim, Suwon-si (KR); Tae In Seo, Cheongju-si (KR); Yong Hee Lee, Siheung-si (KR)

(73) Assignee: SAMBO MOTORS CO., LTD., Daegu (KR)

( * ) Notice: Subject to any disclaimer, the term of this patent is extended or adjusted under 35 U.S.C. 154(b) by 0 days.

(21) Appl. No.: 16/302,395

(22) PCT Filed: May 16, 2017

(86) PCT No.: PCT/KR2017/005067
§ 371 (c)(1),
(2) Date: Nov. 16, 2018

(87) PCT Pub. No.: WO2017/200270
PCT Pub. Date: Nov. 23, 2017

(65) Prior Publication Data
US 2019/0312578 A1 Oct. 10, 2019

(30) Foreign Application Priority Data

May 17, 2016 (KR) .................. 10-2016-0060339
Jun. 15, 2016 (KR) .................. 10-2016-0074228

(51) Int. Cl.
*H03K 17/96* (2006.01)
*G06F 3/044* (2006.01)
*G06F 3/041* (2006.01)

(52) U.S. Cl.
CPC ......... *H03K 17/962* (2013.01); *G06F 3/0414* (2013.01); *G06F 3/0443* (2019.05)

(58) Field of Classification Search
CPC ... H03K 17/962; G06F 3/0443; G06F 3/0414; G06F 3/044; G01R 27/26; G01L 1/14; G01L 1/142; H01H 1/00
(Continued)

(56) References Cited

U.S. PATENT DOCUMENTS

2009/0020343 A1* 1/2009 Rothkopf ............. H03K 17/955
178/18.05
2011/0005845 A1* 1/2011 Hotelling ................ G06F 3/044
178/18.06

(Continued)

FOREIGN PATENT DOCUMENTS

JP 2005-63773 A 3/2005
JP 2011-44362 A 3/2011
(Continued)

OTHER PUBLICATIONS

International Search Report for PCT/KR2017/005067 dated Jul. 26, 2017.
(Continued)

*Primary Examiner* — Edwin A. Leon
(74) *Attorney, Agent, or Firm* — Sughrue Mion, PLLC (57) ABSTRACT

A capacitive switch according to an embodiment of the present invention includes a switch structure having a first electrode pattern; a substrate having a second electrode pattern and an integrated circuit unit; and an elastic body interposed between the switch structure and the substrate, wherein the integrated circuit unit generates a first output signal by detecting a change in capacitance caused by a user touch input operation through the first electrode pattern, the elastic body, and the second electrode pattern, and generates a second output signal by detecting a change in capacitance caused by a user push input operation.

7 Claims, 12 Drawing Sheets

(58) Field of Classification Search
USPC .......................................................... 200/600
See application file for complete search history.

(56) References Cited

U.S. PATENT DOCUMENTS

| | | | | |
|---|---|---|---|---|
| 2012/0199459 A1* | 8/2012 | Reise | ................... | H01H 13/705 |
| | | | | 200/5 A |
| 2013/0093500 A1* | 4/2013 | Bruwer | ................ | H03K 17/955 |
| | | | | 327/517 |
| 2014/0354577 A1* | 12/2014 | Hanssen | ................. | G06F 3/044 |
| | | | | 345/174 |

FOREIGN PATENT DOCUMENTS

| | | |
|---|---|---|
| JP | 2016-81582 A | 5/2016 |
| KR | 10-2016-0041199 A | 4/2016 |

OTHER PUBLICATIONS

Communication of Korean Application No. 10-2016-0074228 dated Jul. 19, 2017.
Communication of Korean Application No. 10-2016-0074228 dated Jan. 19, 2018.

\* cited by examiner

CAPACITIVE SWITCH

CROSS REFERENCE TO RELATED APPLICATIONS

This application is a National Stage of International Application No. PCT/KR2017/005067 filed May 16, 2017, claiming priority based on Korean Patent Application No. 10-2016-0060339, filed May 17, 2016 and Korean Patent Application No. 10-2016-0074228 filed Jun. 15, 2016.

TECHNICAL FIELD

The present invention relates to a capacitive switch, and more particularly, to a capacitive switch for outputting electrical signals for multifunctional execution in response to changes in capacitance depending on a user touch input and a user push input.

BACKGROUND ART

Mechanical switches, capacitive switches, etc. have been used to control electronic products, machine tools, automobiles and related systems, and all types of devices. Conventional switches cannot be used in a multifunctional manner by outputting only a signal for performing one function corresponding to one input. As an alternative to this, a multifunction switch has been proposed. However, conventional multifunction switches have both limitations of a mechanical switch and a capacitive switch because they distinguish functions to be performed in a manner that the mechanical switch and the capacitive switch are mixed. For example, the conventional multifunction switches have a problem of increased structural complexity and manufacturing cost for implementing contacts in the mechanical switch and a problem of increased process complexity and manufacturing cost in the capacitive switch because a number of processes are required for electrode pattern formation, IC packaging, and the like.

DETAILED DESCRIPTION OF THE INVENTION

Technical Problem

The present invention is directed to a capacitive switch for outputting electrical signals for multifunctional execution in response to changes in capacitance depending on a user touch input and a user push input, and a method of operating the capacitive switch.

Technical Solution

According to an aspect of the present invention, a capacitive switch comprising: a switch structure having a first electrode pattern; a substrate having a second electrode pattern and an integrated circuit unit; and an elastic body interposed between the switch structure and the substrate, wherein the integrated circuit unit generates a first output signal by detecting a change in capacitance caused by a user touch input operation through the first electrode pattern, the elastic body, and the second electrode pattern, and generates a second output signal by detecting a change in capacitance caused by a user push input operation.

In some embodiments, a portion of the first electrode pattern extends laterally from an upper surface inside the switch structure or extends from the upper surface inside the switch structure to a lower surface along a side surface inside the switch structure.

In some embodiments, the switch structure comprises: a cap portion; a support portion configured to support the cap portion; and a guide portion configured to guide a moving path of the support portion according to the user push input operation.

In some embodiments, the first electrode pattern is formed on the support portion, and a portion of the first electrode pattern extends laterally from an upper surface of the support portion or extends from the upper surface of the support portion to a lower surface along a side surface of the support portion.

In some embodiments, the first electrode pattern is formed on the support portion and the guide portion, and a portion of the first electrode pattern extends from an upper surface of the support portion to a lower surface of the guide portion along a side surface and a lower surface of the support portion.

In some embodiments, a portion of the second electrode pattern is formed on the elastic body and faces the portion of the first electrode pattern formed on a lower surface of the guide portion with a gap.

In some embodiments, a portion of the first electrode pattern is formed on a bottom surface of the switch structure, and another portion of the first electrode pattern is formed on the elastic body and contacts the portion of the first electrode pattern formed on the bottom surface of the switch structure.

In some embodiments, the user touch input operation does not involve a physical change of the elastic body, and the user push input operation involves a physical change of the elastic body.

In some embodiments, the first electrode pattern is formed directly on the switch structure by a laser direct structuring process or a multiple injection process.

In some embodiments, the capacitive switch further comprises a cover member covering at least a portion of an exposed surface of the first electrode pattern.

Advantageous Effects of the Invention

A capacitive switch according to embodiments of the present invention may reduce structural complexity because there is no need to implement a contact and may prevent the durability from being reduced due to contact wear.

In addition, the capacitive switch according to embodiments of the present invention may be manufactured in a simplified process without being restricted by the shape by using a laser direct structuring process.

BRIEF DESCRIPTION OF THE DRAWINGS

These and/or other aspects will become apparent and more readily appreciated from the following description of the embodiments, taken in conjunction with the accompanying drawings in which.

BEST MODE OF THE INVENTION

The inventive concept may be variously modified and have various example embodiments, so that specific example embodiments will be illustrated in the drawings and described in the detailed description. However, this does not limit the inventive concept to specific example embodiments, and it should be understood that the inventive concept covers all the modifications, equivalents and replacements included within the idea and technical scope of the inventive concept.

In describing the inventive concept, in the following description, a detailed explanation of known related technologies may be omitted to avoid unnecessarily obscuring the subject matter of the inventive concept. In addition, numeral figures (for example, 1, 2, and the like) used during describing the specification are just identification symbols for distinguishing one element from another element.

Further, in the specification, if it is described that one component is "connected" or "accesses" the other component, it is understood that the one component may be directly connected to or may directly access the other component but unless explicitly described to the contrary, another component may be "connected" or "access" between the components.

In addition, each processes may be performed by hardware such as a processor, a micro processor, a micro controller, a central processing unit (CPU), a graphics processing unit (GPU), an accelerated Processing unit (APU), a digital signal processor (DSP), an application specific integrated circuit (ASIC), and a field programmable gate array (FPGA) or a combination of hardware and software in a system.

Moreover, it is intended to clarify that components in the specification are distinguished in terms of primary functions of the components. That is, two or more components to be described below may be provided to be combined to one component or one component may be provided to be divided into two or more components for each more subdivided function. In addition, each of the respective components to be described below may additionally perform some or all functions among functions which other components take charge of in addition to a primary function which each component takes charge of and some functions among the primary functions which the respective components take charge of are exclusively charged by other components to be performed, of course.

Hereinafter, embodiments of the present invention will be described in detail.

Figure 1:
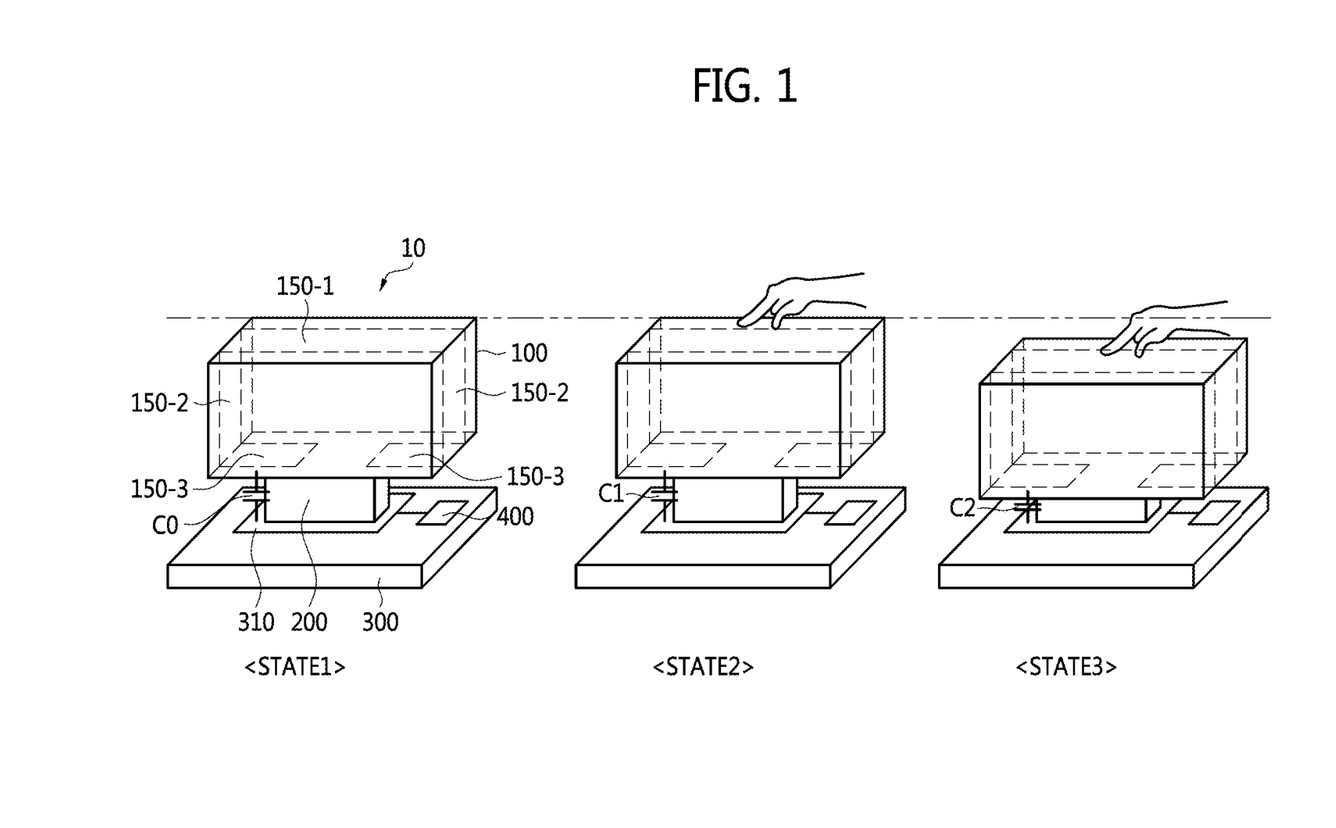
FIG. 1 is a view for explaining a principle of the operation of a capacitive switch, according to embodiments of the present invention.

FIG. 1 is a view for explaining a principle of the operation of a capacitive switch, according to embodiments of the present invention.

Referring to FIG. 1, a capacitive switch 10 may include a switch structure 100, an elastic body 200, and a substrate 300.

The switch structure 100 is a portion where a user touch input according to a user's touch or a user push input according to a user's push is performed.

According to an embodiment, the switch structure 100 may be implemented as an injection molding material of a polymer, and may have a three-dimensional (3D) shape in which at least one surface is planar or curved. According to another embodiment, the switch structure 100 may be implemented as an integral structure (see FIGS. 2 and 3) or a combined structure (see FIGS. 4 to 9) in which a plurality of components are combined. Although not shown in detail in FIG. 1, the switch structure 100 may have a shape in which at least a portion of a bottom surface opposite to an upper surface of the elastic body 200 is opened and an inner space is provided.

The switch structure 100 may include first electrode patterns 150-1, 150-2, and 150-3. According to an embodiment, the first electrode patterns 150-1, 150-2, and 150-3 may be exposed inside the switch structure 100 and may extend laterally from an upper surface inside the switch structure 100, or may extend from the upper surface inside the switch structure 100 to a lower surface along a side surface. In this case, a portion 150-1 of the first electrode patterns may be formed on the upper surface inside the switch structure 100, another portion 150-2 of the first electrode patterns may be formed on the side surface inside the switch structure 100, and the other portion 150-3 of the first electrode patterns may be formed on the lower surface inside the switch structure 100.

According to an embodiment, the first electrode patterns 150-1, 150-2, and 150-3 may be implemented in a floating state to detect a touch input operation or a push input operation of a user.

According to an embodiment, the first electrode patterns 150-1, 150-2, and 150-3 may be formed directly on the switch structure 100 by a laser direct structuring process. For example, the laser direct structuring process may be performed by a process in which a support material is formed from a material including a non-conductive and chemically stable metal complex, and a portion of the support material is exposed to a laser beam such as an ultraviolet (UV) laser or an excimer laser to release a chemical bond of the metal complex to expose a metal seed and then the support material is metalized to form a conductive structure at an area of the support material exposed to the laser beam.

However, the process of forming the first electrode patterns 150-1, 150-2, and 150-3 is not limited to the laser direct structuring process, and the first electrode patterns 150-1, 150-2, and 150-3 may be formed through various patterning processes. For example, the first electrode patterns 150-1, 150-2, and 150-3 may be formed by a patterning process such as double injection, multiple injection, etc., in which injection molding and conductive pattern formation are performed at one time.

Meanwhile, according to an embodiment, in at least a portion of the first electrode patterns 150-1, 150-2, and 150-3, at least a portion of a surface exposed inside the switch structure 100 may be covered with a cover member (not shown). The cover member may include the same material as that of the switch structure 100, but is not limited thereto. The cover member may include a material different from that of the switch structure 100, or may have a multi-layer structure. Durability of the first electrode patterns 150-1, 150-2, and 150-3 may be improved by the cover member.

The elastic body 200 may be interposed between the switch structure 100 and the substrate 300. The elastic body 200 is interposed between the switch structure 100 and the substrate 300 so that the elastic body 200 is contracted when a user applies a push input operation to the switch structure 100 and then restored to its original shape by elasticity when the push input operation is completed, thereby restoring the switch structure 100 to its original position.

According to an embodiment, the elastic body 200 may include an elastic material (e.g., rubber) as an insulating material.

According to an embodiment, the substrate 300 may include a printed circuit board (PCB), a flexible PCB (FPCB), or the like.

The substrate 300 may include a second electrode pattern 310 and an integrated circuit unit 400.

The second electrode pattern 310 may have a shape corresponding to the first electrode patterns 150-1, 150-2, and 150-3, but the present invention is not limited thereto. The second electrode pattern 310 may be implemented in various shapes and sizes.

The integrated circuit unit 400, through the first electrode patterns 150-1, 150-2, and 150-3, the elastic body 200, and the second electrode pattern 310, may generate a first output signal by detecting a change in capacitance caused by a user touch input operation, and may generate a second output signal by detecting a change in capacitance caused by a user push input operation.

In FIG. 1, a first state STATE1 denotes a state where no user input operation is performed, a second state STATE2 denotes a state where a user touch input operation is performed, and a third state STATE3 denotes a state where a user push input operation is performed.

Here, the user touch input operation does not involve a physical change of the elastic body 200, and the user push input operation may involve a physical change of the elastic body 200.

When capacitance between the first electrode patterns 150-1, 150-2, and 150-3 and the second electrode pattern 310 has a first value C0 in the first state STATE1, the capacitance has a second value C1 by the user touch input operation in second state STATE2 and the capacitance has a third value C2 by the user push input operation in the third state STATE3.

That is, the integrated circuit unit 400 may detect a change in capacitance between the first state STATE1, the second state STATE2, and the third state STATE3 to distinguish the user touch input operation from the user push input operation, and may perform a corresponding function by outputting an output signal corresponding to each of the user touch input operation and the user push input operation.

According to an embodiment, the second state STATE2 and the third state STATE3 may be implemented as sequential user input operations. For example, the second state STATE2 may be implemented as a preliminary input to activate the third state STATE3. In this case, when the second state STATE2 is detected according to the user touch input operation, the integrated circuit unit 400 may provide guidance information about the user push input operation through a visual or auditory device. Here, a user may perform the push input operation according to provided guidance information. When the third state STATE3 is detected according to the user push input operation, the integrated circuit unit 400 may perform a predetermined specific function.

Figure 2:
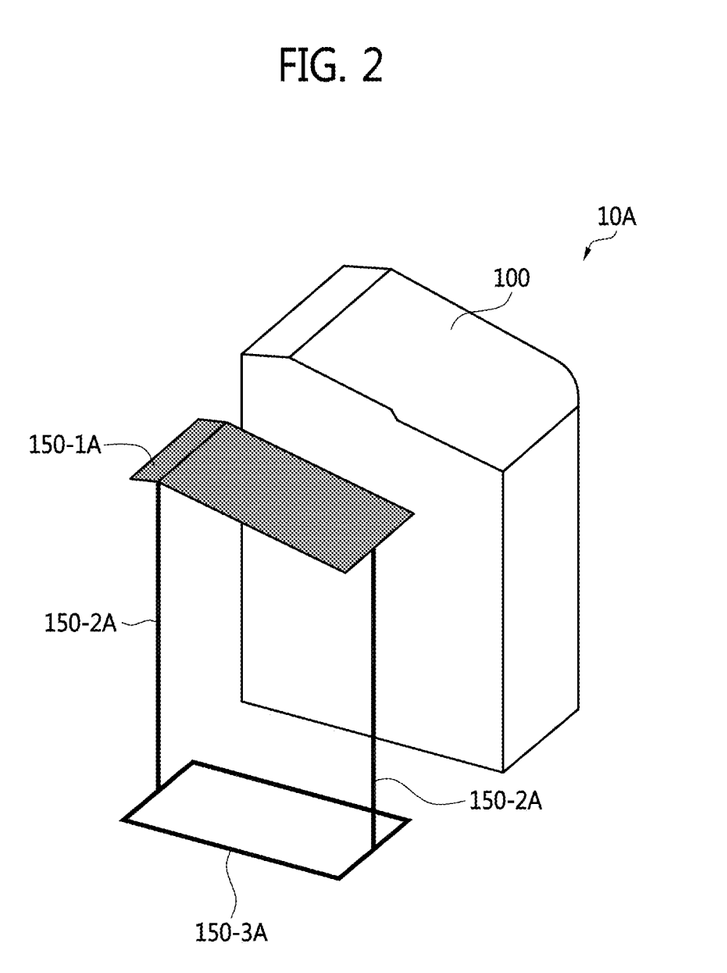
FIGS. 2 and 3 are views of a portion of a capacitive switch according to an embodiment of the present invention.
Figure 3:
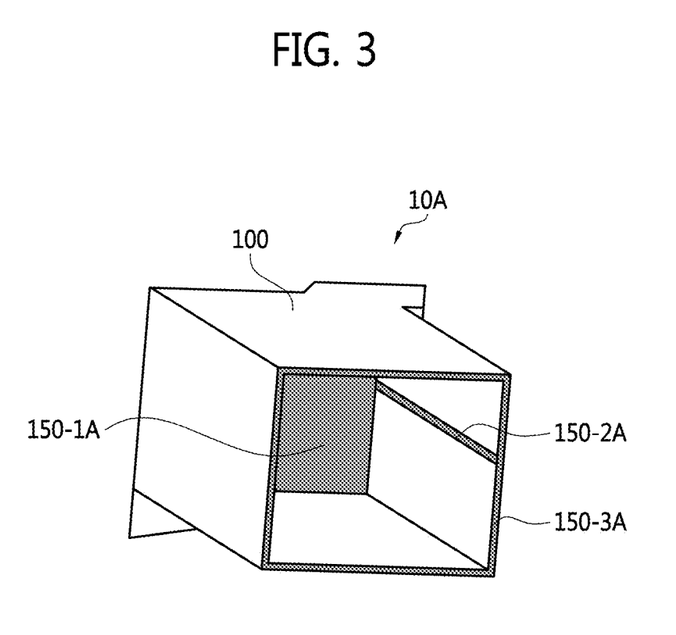

FIGS. 2 and 3 are views of a portion of a capacitive switch according to an embodiment of the present invention. FIGS. 2 and 3 show a portion of a capacitive switch 10A according to an embodiment for convenience of explanation.

Referring to FIGS. 1 to 3, the switch structure 100 may be integrally formed.

In this case, first electrode patterns 150-1A, 150-2A, and 150-3A may be formed over an upper surface, a side surface, and a lower surface inside the switch structure 100.

A portion 150-1A (hereinafter referred to as a first portion) of the first electrode patterns may be formed on the upper surface inside the switch structure 100. In FIGS. 2 and 3, the first portion 150-1A has a shape covering the entire upper surface inside the switch structure 100, but is not limited thereto. For example, when a light emitting device is provided on the substrate 300, a light transmitting region may be formed on the switch structure 100, and the first portion 150-1A may have a shape having a vacant region corresponding to the light transmitting region.

Another portion 150-2A (hereinafter referred to as a second portion) of the first electrode patterns may be connected to the first portion 150-1A and may be formed on a side surface inside the switch structure 100. In FIGS. 2 and 3, a plurality of second portions 150-2A are formed on side surfaces facing each other inside the switch structure 100, respectively, but the present invention is not limited thereto. The second portions 150-2A may be formed on one side surface inside the switch structure 100. It is understood that the second portion 150-2A may have various widths, thicknesses, and shapes.

The other portion 150-3A (hereinafter referred to as a third portion) of the first electrode patterns may be connected to the second portion 150-2A and may be formed on the lower surface of the switch structure 100. In detail, the third portion 150-3A may be formed to cover a bottom surface of at least a portion of side walls defining an inner space of the switch structure 100, and may be connected to the second portion 150-2A formed on an outer surface of the side walls.

Figure 4:
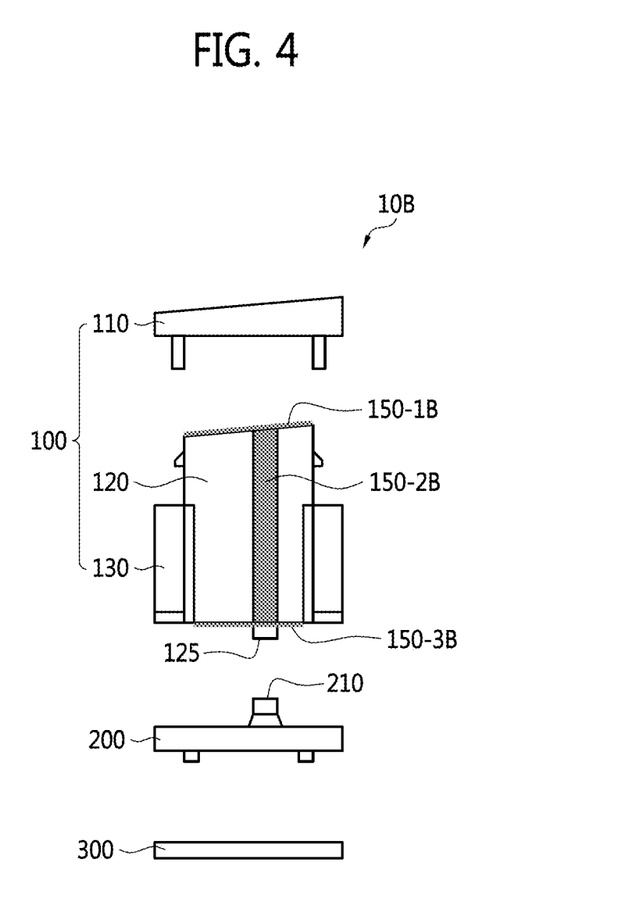
FIGS. 4 and 5 are views of a capacitive switch according to another embodiment of the present invention.
Figure 5:
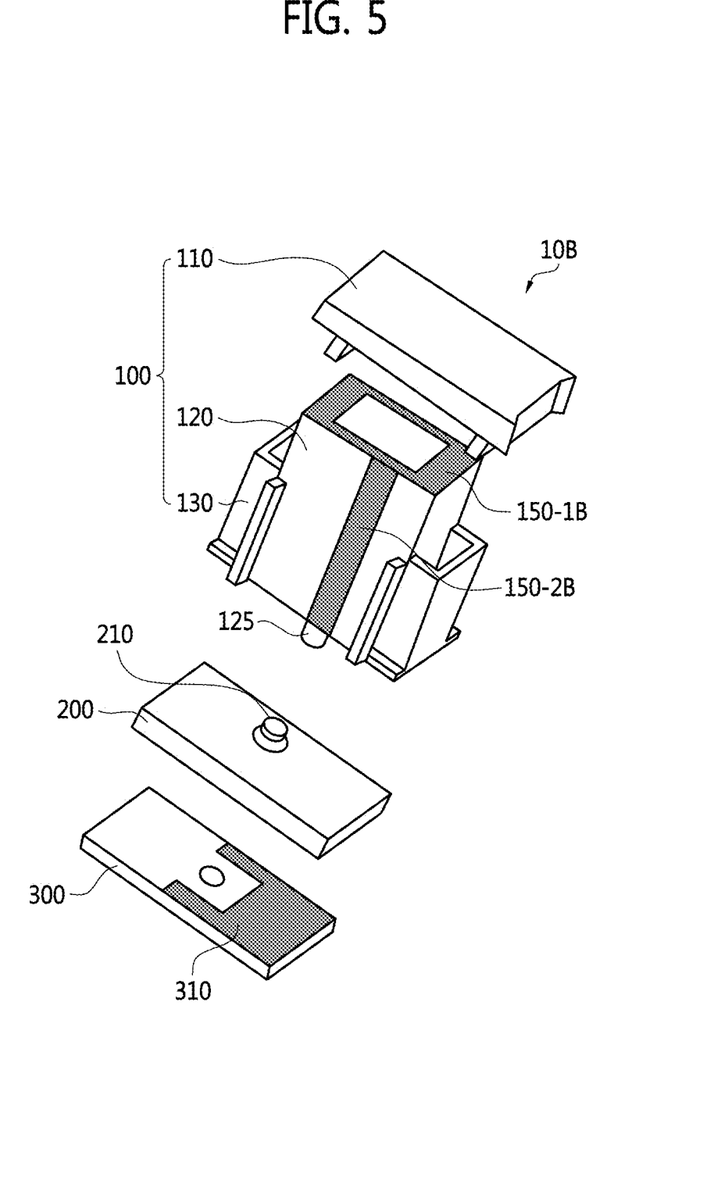

FIGS. 4 and 5 are views of a capacitive switch according to another embodiment of the present invention.

Referring to FIGS. 1, 4, and 5, a capacitive switch 10B may include the switch structure 100, the elastic body 200, and the substrate 300.

According to an embodiment, the switch structure 100 may be implemented as a combined structure in which a plurality of components are combined. In this case, the switch structure 100 may include a cap portion 110, a support portion 120, and a guide portion 130.

The cap portion 110, which is a portion that a user touches for a user touch input operation or a user push input operation, may be formed separately from the support portion 120 that supports the cap portion 110 and combined with the support portion 120.

The support portion 120 may have a square pipe structure having an empty space therein. However, the support portion 120 is not limited thereto. The support portion 120 may have a pipe structure of various shapes such as a circular shape with a vertical cross section of hollow shape in an axial direction. The guide portion 130 may be coupled to a side surface of the support portion 120 or may be integrally formed with the support portion 120. The guide portion 130 may be coupled with an external structure to guide an up and down path of the support portion 120.

In the capacitive switch 10B of FIGS. 4 and 5, first electrode patterns 150-1B, 150-2B, and 150-3B may be formed on the support portion 120. In detail, a portion 150-1B of the first electrode patterns may be formed on an upper surface of the support portion 120, another portion 150-2B of the first electrode patterns may be formed on a side surface of the support portion 120, and the other portion 150-3B of the first electrode patterns may be formed on a lower surface of the support portion 120.

According to an embodiment, the elastic body 200 is formed with a protrusion 210 to be in contact with a protrusion 125 of the support portion 120. The elastic body 200 is contracted according to a user's push input operation and then restored to its original shape by elasticity when the push input operation is completed, thereby restoring the switch structure 100 to its original position.

Figure 6:
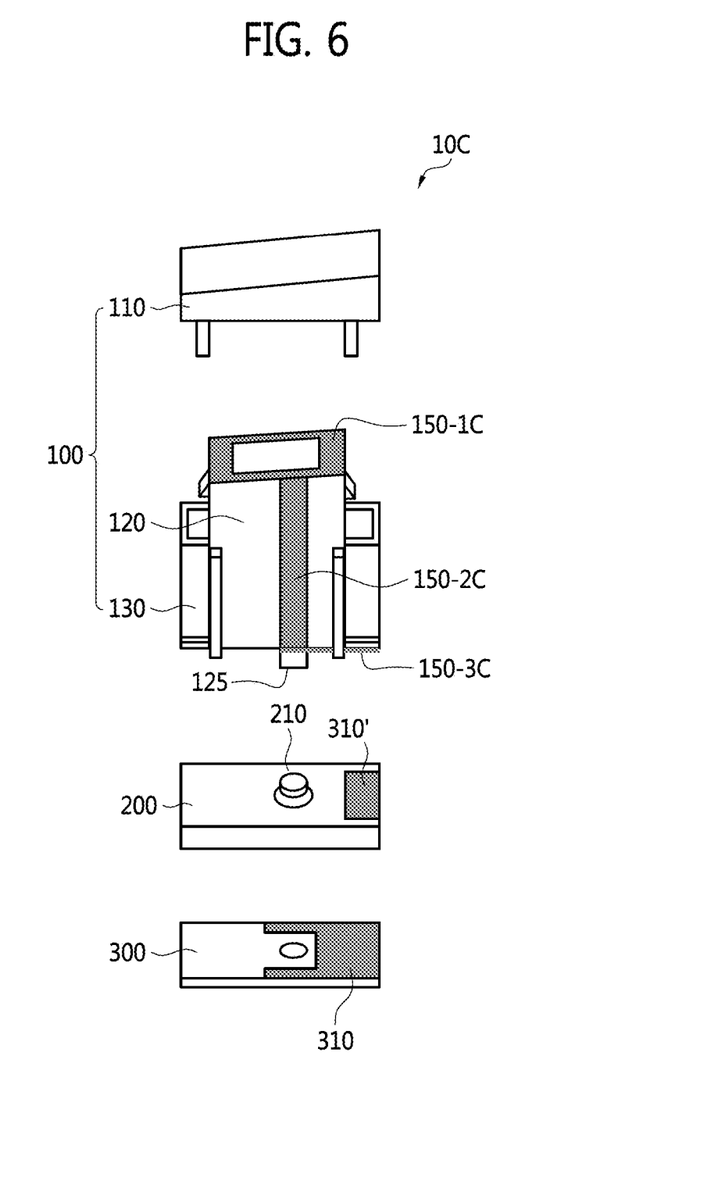
FIGS. 6 and 7 are views of a capacitive switch according to another embodiment of the present invention.
Figure 7:
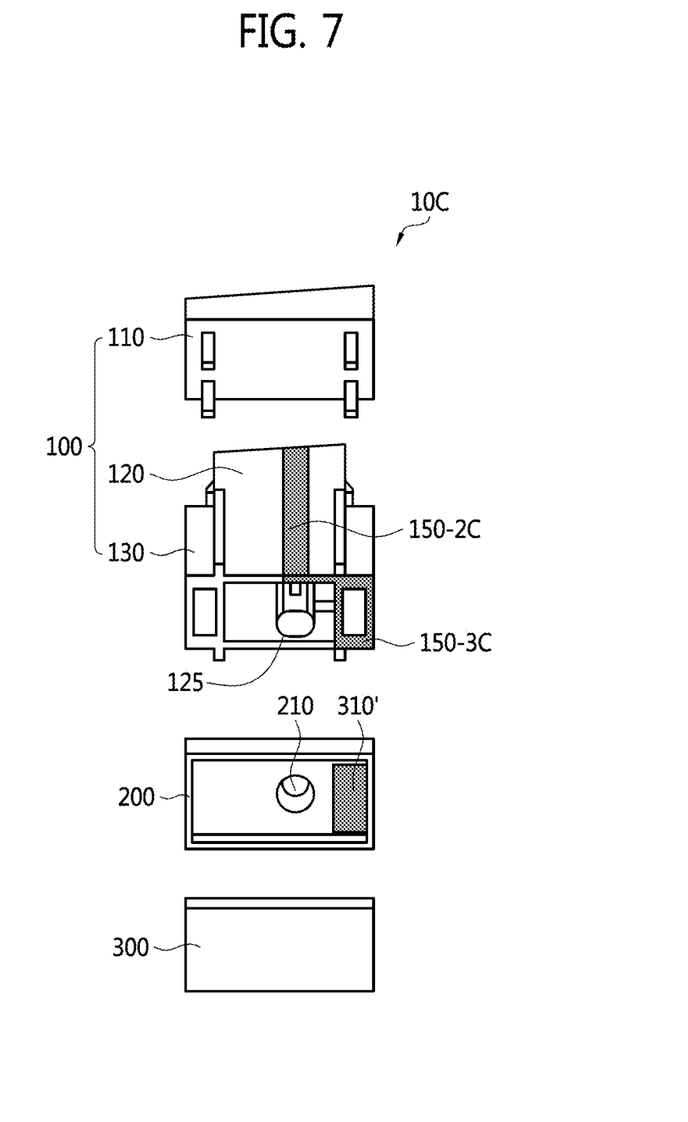

FIGS. 6 and 7 are views of a capacitive switch according to another embodiment of the present invention.

Referring to FIGS. 6 and 7, in a capacitive switch 10C of FIGS. 6 and 7, a portion 150-3C of first electrode patterns 150-1C, 150-2C, and 150-3C may extend to the guide portion 130. In this case, the first electrode patterns 150-1C, 150-2C, and 150-3C may extend from an upper surface of the support portion 120 to a lower surface of the guide portion 130 along a side surface and a lower surface of the support portion 120.

Furthermore, an extended portion 310' of the second electrode pattern 310 may be formed in a region corresponding to a region where the second electrode pattern 310 is formed on the substrate 300 in the elastic body 200, and may be electrically connected to the second electrode pattern 310 formed on the substrate 300. The extended portion 310' of the second electrode pattern 310 may face a portion 150-3C of the first electrode patterns formed on the lower surface of the guide portion 130 with a gap. Meanwhile, the extended portion 310' of the second electrode pattern 310 may be spaced apart from the portion 150-3C of the first electrode patterns even when a user's switch push input operation is performed.

Figure 8:
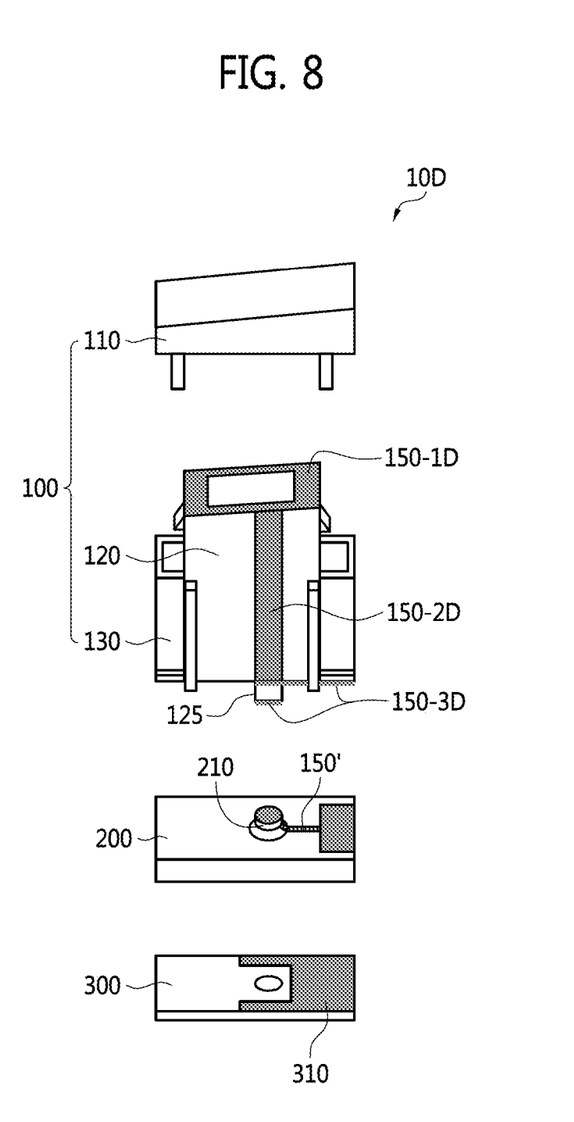
FIGS. 8 and 9 are views of a capacitive switch according to another embodiment of the present invention.
Figure 9:
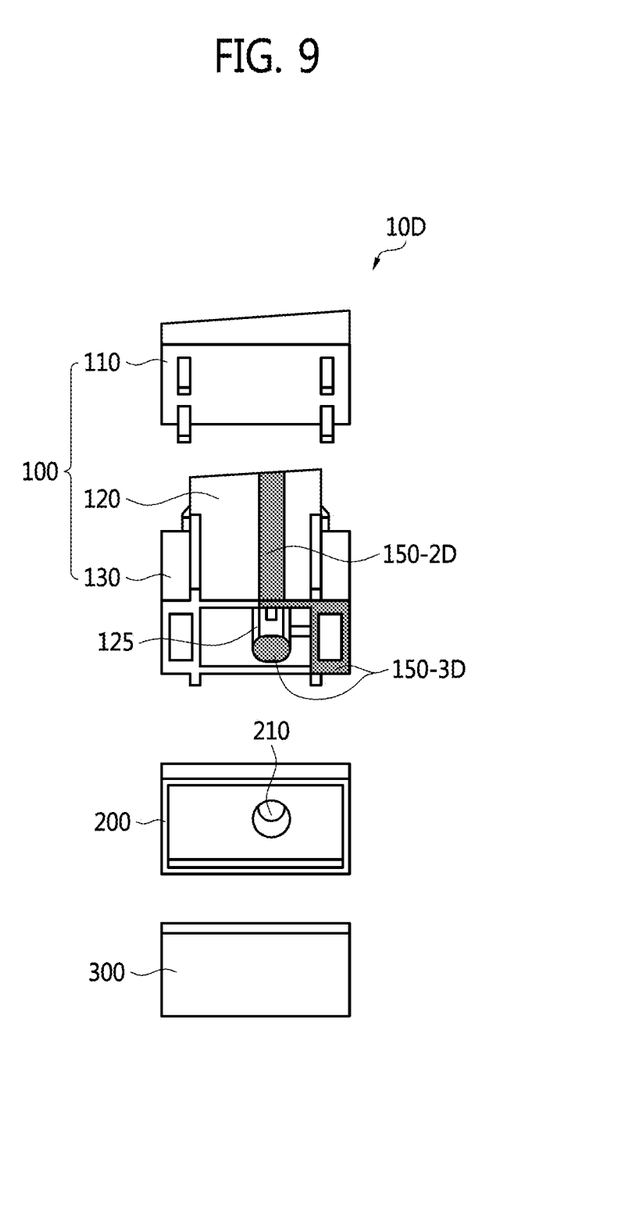

FIGS. 8 and 9 are views of a capacitive switch according to another embodiment of the present invention.

Referring to FIGS. 8 and 9, in a capacitive switch 10D of FIGS. 8 and 9, a portion 150-3D of first electrode patterns may be formed on the lower surface of the guide portion 130 and the protrusion 125 of the support portion 120.

An extended portion 150' of the first electrode patterns may be formed on the elastic body 200. According to an embodiment, the extended portion 150' of the first electrode patterns may further be formed on the protrusion 210 of the elastic body 200 and the extended portion 150' of the first electrode patterns formed on the protrusion 210 of the elastic body 200 may be electrically connected to the portion 150-3D of the first electrode patterns formed on the protrusion 125 of the support portion 120.

Figure 10:
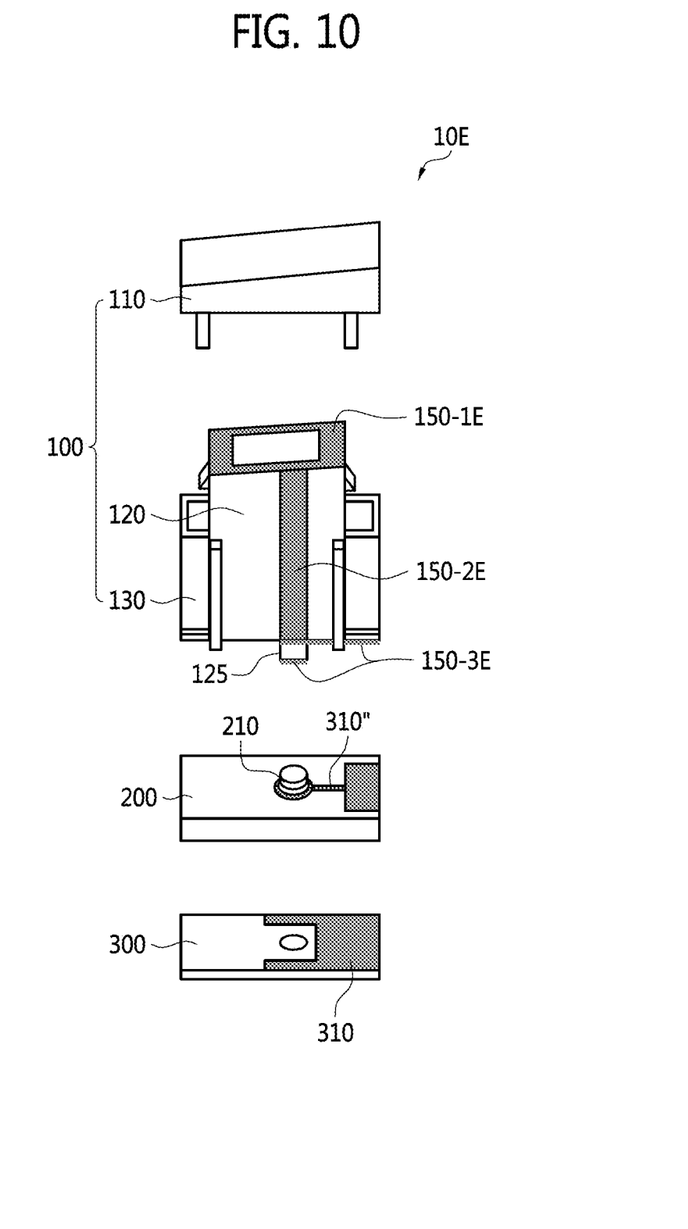
FIGS. 10 and 11 are views of a capacitive switch according to another embodiment of the present invention.
Figure 11:
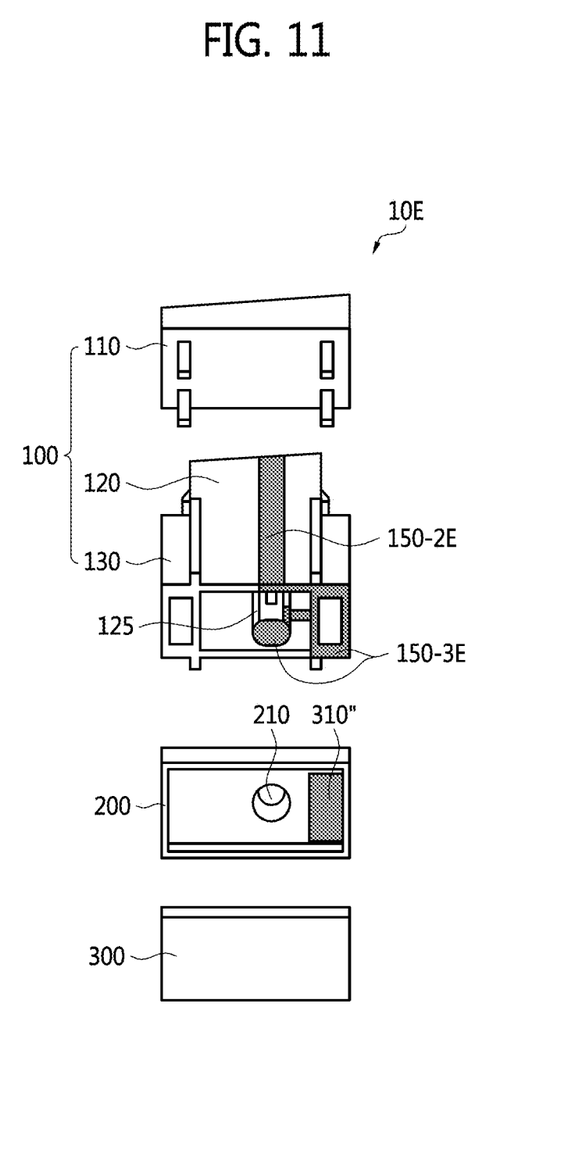

FIGS. 10 and 11 are views of a capacitive switch according to another embodiment of the present invention.

Referring to FIGS. 10 and 11, in a capacitive switch 10E of FIGS. 10 and 11, a portion of an extended portion 310" of a second electrode pattern may be formed in the elastic body 200 in a shape corresponding to a bottom surface of the guide portion 130 and the other portion of the extended portion 310" of the second electrode pattern may be formed in the shape of a ring on an outer edge of the protrusion 210 excluding an upper surface of the protrusion 210 and may be connected to each other.

According to an embodiment, a position and a width of the ring shape may vary.

Here, a portion of the extended portion 310" of the second electrode pattern formed in the ring shape may have high durability because the portion of the extended portion 310" of the second electrode pattern does not contact a first electrode pattern 150-3E formed on the protrusion 125 of the support portion 120 even when a user push input is performed.

Furthermore, the portion of the extended portion 310" of the second electrode pattern formed in the ring shape may be formed so as to be as close as possible to the first electrode pattern 150-3E formed on the protrusion 125 of the support portion 120 without contacting the first electrode pattern 150-3E.

In the other portion (hereinafter referred to as a third portion) of the first electrode pattern 150-3E, a portion formed on a bottom surface of the protrusion 125 of the support portion 120 and a portion formed on the bottom surface of the guide portion 130 may be connected to each other.

Figure 12:
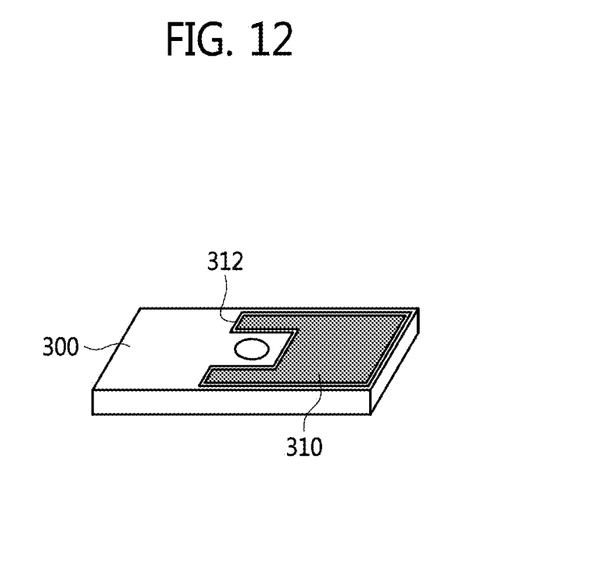
FIG. 12 is a view of an example in which an additional pattern is formed on a substrate shown in FIGS. 4 to 11.

FIG. 12 is a view of an example in which an additional pattern is formed on the substrate shown in FIGS. 4 to 11.

Referring to FIGS. 4 to 12, a ground pattern 312 may be formed together with the second electrode pattern 310 on the substrate 300. The ground pattern 312 may be formed on an outer edge of the second electrode pattern 310 so as not to contact the second electrode pattern 310.

Here, the ground pattern 312 formed on the substrate 300 may prevent external noise, thereby preventing malfunction of the capacitive switches 10A to 10E due to external noise.

Hereinabove, the present invention has been described with reference to the preferred embodiments of the present invention. However, it will be appreciated by those skilled in the art that various modifications and changes of the present invention can be made without departing from the spirit and the scope of the inventive concept which are defined in the appended claims and their equivalents.

The invention claimed is:

1. A capacitive switch comprising:
a switch structure having a first electrode pattern;
a substrate having a second electrode pattern and an integrated circuit unit; and
an elastic body interposed between the switch structure and the substrate,
wherein the integrated circuit unit generates a first output signal by detecting a change in capacitance caused by a user touch input operation through the first electrode pattern, the elastic body, and the second electrode pattern, and generates a second output signal by detecting a change in capacitance caused by a user push input operation,
wherein the switch structure comprises:
a cap portion;
a support portion configured to support the cap portion; and
guide portion configured to guide a moving path of the support portion according to the user push input operation, and
wherein a portion of the first electrode pattern extends from an upper surface of the support portion to a lower surface along a side surface of the support portion.

2. The capacitive switch of claim 1, wherein the first electrode pattern is formed on the support portion and the guide portion, and
a portion of the first electrode pattern extends from the upper surface of the support portion to a lower surface of the guide portion along a side surface and a lower surface of the support portion.

3. The capacitive switch of claim 2, wherein a portion of the second electrode pattern is formed on the elastic body and faces the portion of the first electrode pattern formed on a lower surface of the guide portion with a gap.

4. The capacitive switch of claim 1, wherein a portion of the first electrode pattern is formed on a bottom surface of the switch structure, and another portion of the first electrode pattern is formed on the elastic body and contacts the portion of the first electrode pattern formed on the bottom surface of the switch structure.

5. The capacitive switch of claim 1, wherein the user touch input operation does not involve a physical change of the elastic body, and
the user push input operation involves a physical change of the elastic body.

6. The capacitive switch of claim 1, wherein the first electrode pattern is formed directly on the switch structure by a laser direct structuring process or a multiple injection process.

7. The capacitive switch of claim 1, wherein the capacitive switch further comprises a cover member covering at least a portion of an exposed surface of the first electrode pattern.

* * * * *